(12) United States Patent
Tomioka et al.

(10) Patent No.: US 6,861,675 B2
(45) Date of Patent: Mar. 1, 2005

(54) OPTICALLY COUPLED SEMICONDUCTOR DEVICE AND METHOD FOR MANUFACTURING THE SAME

(75) Inventors: Taizo Tomioka, Yokohama (JP); Ikuo Mori, Kawasaki (JP); Kenji Ito, Tokyo (JP); Mutsumi Suematsu, Yokohama (JP); Yasuhito Saito, Yokohama (JP); Masayuki Arakawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 10/606,762

(22) Filed: Jun. 27, 2003

(65) Prior Publication Data

US 2004/0000674 A1 Jan. 1, 2004

(30) Foreign Application Priority Data

Jun. 28, 2002 (JP) ......................................... 2002-191201

(51) Int. Cl.$^7$ ............................................. H01L 31/12
(52) U.S. Cl. .............................. 257/82; 257/80; 257/81; 257/724
(58) Field of Search ............................. 257/80–82, 724

(56) References Cited

U.S. PATENT DOCUMENTS 5,545,893 A * 8/1996 Brown et al. ............... 250/239
5,665,983 A * 9/1997 Nagano ........................ 257/81
6,388,264 B1 * 5/2002 Pace ............................ 250/551

FOREIGN PATENT DOCUMENTS

JP          540800994 A   *  6/1979    ........... H01L/31/12
JP          11-163705         6/1999

* cited by examiner

Primary Examiner—Allan R. Wilson
(74) Attorney, Agent, or Firm—Oblon, Spivak, McClelland, Maier & Neustadt, P.C.

(57) ABSTRACT

An optically coupled semiconductor device according to the present invention comprises a mount electrode and a wire electrode which are formed on a top main face of the first wiring substrate, a light-emitting element is electrically connected to the mount electrode and the wire electrode, a first electrode pad and a second electrode pad which are provided on the top main face of the second wiring substrate in such a manner as to sandwich the opening formed in the second wiring substrate, a photo-receptor element which is arranged in such a manner as to block the opening formed in the second wiring substrate and which is connected to the first electrode pad so as to face the light-emitting element, and a switching element which is connected to the second electrode pad so as to face the wire.

9 Claims, 3 Drawing Sheets

OPTICALLY COUPLED SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2002-191201, filed Jun. 28, 2002, the entire contents of which are incorporated herein by reference.

BACKGROUND OF THE INVENTION

1. Field of the Invention

The present invention relates to an optically coupled semiconductor device which is applied to a measuring instrument such as a tester and a method for manufacturing the device.

2. Description of the Related Art

Recently, a non-contact relays such as an optically coupled semiconductor device has been used in an increasing number of cases in order to improve reliabilities. A tester uses thousands of optically coupled semiconductor devices therein in some cases, so that miniaturization of the optically coupled semiconductor devices is desired greatly in order to miniaturize the tester. Based on such a market trend, a variety of optically coupled semiconductor devices have been developed.

One of such optically coupled semiconductor devices is disclosed in, for example, Jpn. Pat. Appln. Laid-Open No. 11-163705. This optically coupled semiconductor device has, as shown in FIG. 10, a wiring substrate 23, in which a recess 24 and a wiring pattern (not shown) are formed. A light-emitting element 25 is die-bonded to a bottom of the recess 24 in the wiring substrate 23 and wire-bonded by a gold wire 26.

Furthermore, on the wiring substrate 23, there is provided a photo-receptor element 29 in such a manner as to cover an upper-side opening of the recess 24 and to be opposite to the light-emitting element 25. The photo-receptor element 29 is flip-chip bonded to the wiring substrate 23 via a bump 34.

On the same surface of the wiring substrate 23 as that on which the photo-receptor element 29 is mounted, a switching element 27 is flip-chip bonded via a bump 28. The photo-receptor element 29 and the switching element 27 are electrically connected with each other through a wiring pattern, not shown, on the substrate 23.

A space between the light-emitting element 25 and the photo-receptor element 29 is filled with a translucent silicone resin 30, while the photo-receptor element 29 and the switching element 27 on the wiring substrate 23 are both sealed with a light-blocking resin 31.

In this optically coupled semiconductor device, by mounting the photo-receptor element 29 and the switching element 27 by flip-chip bonding, it is possible to eliminate a necessity of forming a pad for wire bonding, thereby miniaturizing the optically coupled semiconductor device.

It is to be noted that this switching element 27 in this case needs to be constituted of a lateral double diffused MOSFET in which a gate, a source, and a drain are in the same plane of a chip. In a case where a switching element is used in which a drain electrode is formed on a back face of the chip, it is to be mounted by wire bonding as shown in FIG. 11.

However, there have been the following problems conventionally.

First, when die-bonding the light-emitting element 25 into the recess 24 in the wiring substrate 23 and wire-bonding it, it is necessary to set a size of the recess 24 large so that a capillary of a wire bonder may not interfere with the wiring substrate 23. Therefore, the light-emitting element 29 covering the recess 24 becomes large more than necessary.

It is to be noted that although the size of the recess 24 might be reduced by using a capillary having an extremely thin tip, such a capillary is deteriorated in durability and ultrasonic vibration characteristic, thus deteriorating productivity greatly.

Further, since the wiring substrate 23 needs to have an additional substrate area for mounting the switching element 27 besides an area for forming the recess 24, it has been difficult to miniaturize the optically coupled semiconductor device further.

BRIEF SUMMARY OF THE INVENTION

In view of the above circumstances, the present invention has been developed, and it is an object of the present invention to provide an optically coupled semiconductor structure suitable for miniaturization of an optically coupled semiconductor device and a method for manufacturing the structure.

An optically coupled semiconductor device according to a first aspect of the present invention comprises a multi-layer wiring substrate which is constituted by stacking a second wiring substrate on a first wiring substrate and which has an opening formed in the second wiring substrate; a mount electrode and an electrode for wire-bonding which are formed on a top main face of the first layer and which are disposed at diagonal positions of the opening formed in the second wiring substrate; a light-emitting device whose one terminal is electrically connected to the mount electrode and whose other terminal is electrically connected to the electrode for wire-bonding via a wire and which is arranged so that its light-emitting face may face the opening; a first electrode pad and a second electrode pad which are provided on the top main face of the second wiring substrate in such a manner as to sandwich the opening formed in the second wiring substrate; a photo-receptor element which is arranged in such a manner as to block the opening formed in the second wiring substrate and which is electrically connected to the first electrode pad so that a light-receiving face thereof may face the light-emitting face of the light-emitting device; a switching element which is arranged in such a manner as to block the opening formed in the second wiring substrate and which is electrically connected to the second electrode pad so as to face the wire; and a sealant which seals the opening formed in the second wiring substrate.

An optically coupled semiconductor device manufacturing method according a second aspect comprises stacking a second wiring substrate having an opening on a first wiring substrate to constitute a multi-layer wiring substrate; forming a mount electrode and an electrode for wire-bonding on a top main face of the first wiring substrate so that they may be disposed at diagonal positions of the opening; electrically connecting one terminal of a light-emitting device to the mount electrode and the other terminal to the electrode for wire-bonding via a wire so that a light-emitting face thereof may face the opening; providing a first electrode pad and a second electrode pad on the top main face of the second wiring substrate so as to sandwich the opening formed in the second wiring substrate; arranging a photo-receptor element in such a manner as to block the opening formed in the second wiring substrate and electrically connecting the photo-receptor element to the first electrode pad so that a light-receiving face thereof may face the light-emitting face of the light-emitting device; arranging a switching element in such a manner as to block the opening formed in the second wiring substrate and electrically connecting the switching element to the second electrode pad so that the switching element may face the wire; and sealing the opening in the second wiring substrate with a sealant.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

The following will detail the present invention with reference to embodiments shown in drawings.

Figure 1:
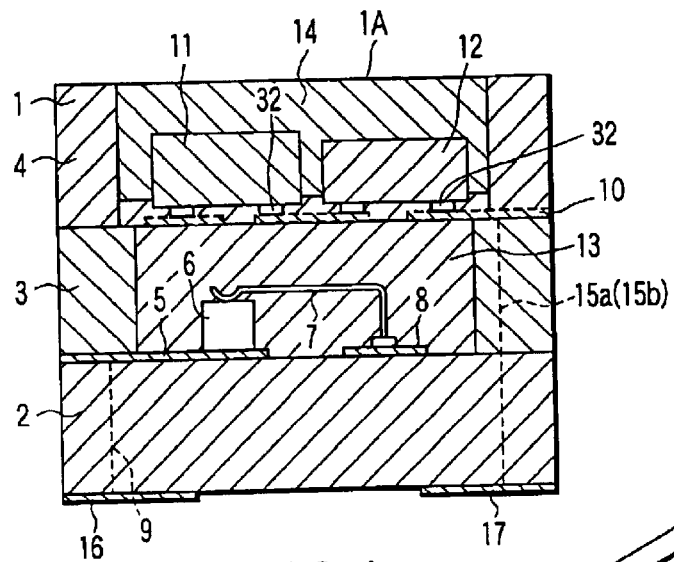
FIG. 1 is a cross-sectional view for showing an optically coupled semiconductor device structure according to a first embodiment of the present invention.

FIG. 1 shows an optically coupled semiconductor device structure according to a first embodiment of the present invention.

A wiring substrate 1 is a multi-layer wiring substrate. A first layer 2, a second layer 3, and a third layers 4, which are each an aluminum-made rectangular insulated substrate, are sequentially stacked in such a manner as to sandwich a wiring pattern. The wiring substrate 1 has outer dimensions of 2.0 mm (width)×2.0 mm (depth)×1.7 mm (height). The second layer 3 and the third layer 4 are each shaped like a frame. In a cavity defined by the frame itself so as to have a rectangular opening, there is exposed the wiring pattern formed on a surface of the first layer 2. Finally, this cavity is filled to complete a semiconductor device.

As the wiring pattern on the surface of the first layer 2 are there provided a mount electrode 5 and a wire electrode (electrode for wire-bonding) 8 in such a manner that they may be exposed in the cavity. The mount electrode 5 and the wire electrode 8 each have a wiring line which is formed so as to be led out to an outer periphery of the first layer, which wiring line is covered by the second layer 3. The wiring pattern is made of tungsten as a base, a surface of which is plated with nickel and gold sequentially. To miniaturize the semiconductor device, the mount electrode 5 and the wire electrode 8 are preferably disposed at diagonal positions of the rectangular cavity.

On the mount electrode 5, there is arranged a light-emitting diode (LED) as a light-emitting element (device) 6. One terminal of the light-emitting element 6 is electrically connected to the mount electrode 5. The other terminal of the light-emitting element 6 constitutes a light emitting face, which is exposed toward the opening of the cavity. The other terminal and the wire electrode 8 are electrically interconnected via a gold wire 7. The gold wire 7 is extended substantially along a diagonal line of the opening. The opening of the cavity defined by the second layer 3 has dimensions of 1.4 mm (width)×0.7 mm (depth)×0.6 mm (thickness), being regulated in height so that a highest portion of the gold wire 7 may not go out of the opening in the second layer 3. Therefore, first a gold ball formed on a tip of a capillary of the gold wire 7 is ball-bonded to the wire electrode 8; then, the capillary is raised vertically to extend the wire connected from the gold ball toward the opening of the cavity; and then, the capillary is moved roughly horizontally to be wedge-bonded to the terminal of the light-emitting element 6, thereby forming a loop.

In one side periphery face of the first layer 2, there is extended a notch 9 having a semi-circular cross section in such a manner as to link both the main faces. A surface of the notch 9 is wired. The notch 9 electrically links mutually the mount electrode 5 and a first externally connected electrode 16 formed on a back face as viewed with respect to the main face, on which the mount electrode 5 of the first layer 2 is formed.

On a frame-shaped main face of the second layer 3, a plurality of electrode pads 10 are formed. A photovoltaic diode array (photo-receptor element) 11 is arranged in such a manner as to block the opening formed in the second layer 3. On a surface of the photovoltaic diode array 11, there is formed an electrode pad, which is electrically connected via ball bumps 32 to the electrode pads 10 of the second layer 3. That is, the electrode pads 10 on the photovoltaic diode array 11 are provided in such a manner as to sandwich the opening formed in the second layer 3. A light-receiving portion of the photovoltaic diode array 11 is formed on the same face as the electrode and arranged and arranged to face the light-emitting face of the light-emitting element 6. A MOSFET (switching element) 12 is arranged in such a manner as to block the opening in the second layer 3 as the photovoltaic diode array 11 is, being flip-chip connected to other electrode pads 10 on the second layer 3 via the ball bump 32. That is, the electrode pads 10 on the MOSFET 12 are provided in such a manner as to sandwich the opening formed in the second layer 3. The MOSFET 12 is arranged so as to face the gold wire 7.

The third layer 4 is arranged on a face where the photovoltaic diode array 11 and the MOSFET 12 of the second layer 3 are provided. The opening formed in the third layer 4 is set larger than the opening formed in the second layer 3, in which opening formed in the third layer 4 are there exposed the opening formed in the second layer 3, the photovoltaic diode array 11, and the MOSFET 12. The third layer 4 is formed to have such a thickness that the photovoltaic diode array 11 and the MOSFET 12 can be accommodated.

Although in the present embodiment the third layer 4 has been constituted of a frame-shaped insulated substrate to improve productivity, it may be constituted of a concave substrate because it is necessary only to protect the photovoltaic diode array 11 and the MOSFET 12. It may also be constituted of a conductive member unless it prevents the wiring line or the element from working properly.

Figure 2:
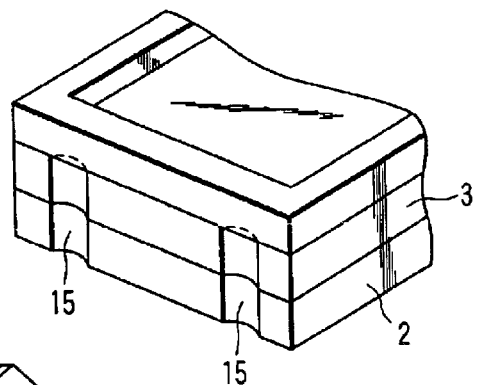
FIG. 2 is a perspective view for showing notches formed in an outer side face of a wiring substrate.

In the other side periphery faces of the first and second layers 2 and 3 are there vertically formed notches 15a and 15b having a semi-circular cross section respectively as shown in FIG. 2. Surfaces of the notches 15a and 15b are wired. The notches 15a and 15b serve to electrically link with each other the electrode pad 10 and an second external electrode 17 provided on the back face of the first layer 2.

The electrode 10, to which the drain electrode of the MOSFET 12 is connected, is electrically connected to the externally connected electrode 17 through the notches 15a and 15b. The gate electrode and the source electrode of the MOSFET 12 are electrically connected via the electrode 10 on the second layer 3 to an anode electrode and a cathode electrode of the photovoltaic diode array 11 respectively.

The cavity defined by the second layer 3 and the third layer 4 is filled with a translucent silicone resin 13. Furthermore, on a top side of the silicone resin 13, there is deposited a light-blocking epoxy resin 14 so as to seal the photovoltaic diode array 11 and the MOSFET 12.

In this configuration, when the light-emitting face of the light-emitting element 6 emits light, the light is received by a light-receiving face of the photovoltaic diode array 11, which in turn generates electromagnetic force, thereby turning the MOSFET 12 ON/OFF.

The following will describe a method for manufacturing such an optically coupled semiconductor device as described above, with reference to FIGS. 3–7.

Figure 3:
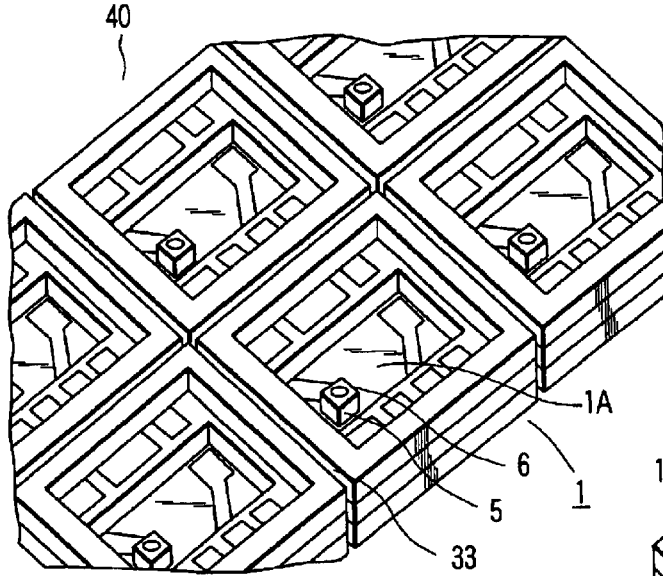
FIG. 3 is an illustrative view for showing a manufacturing step of the optically coupled semiconductor device.

First, as shown in FIG. 3, a molded base material 40 obtained by forming the plurality of multi-layer wiring substrates 1 adjacently to each other into a sheet is prepared, and in a surface of this molded base material 40, there are formed dividing grooves 33 in such a manner as to divide it into the multi-layer wiring substrates 1. The wiring substrates 1 are manufactured as it is in a form of the sheet and, finally, sub-divided into individual optically coupled semiconductor devices.

Figure 4:
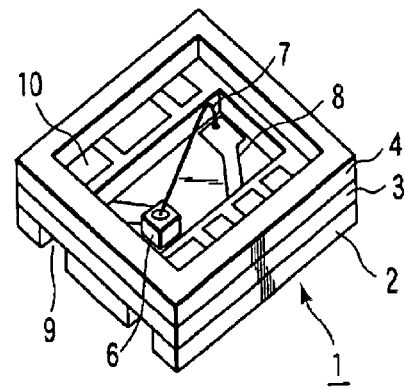
FIG. 4 is an illustrative view for showing the next manufacturing step of the optically coupled semiconductor device.

First, the light-emitting element 6 is inserted into the opening in the wiring substrate 1 and die-bonded using silver paste onto the mount electrode 5 on the first layer 2 to then heat the silver paste in order to harden it. Subsequently, as shown in FIG. 4, the light-emitting element 6 and the wire electrode 8 are interconnected by the metal wire 7.

Figure 5:
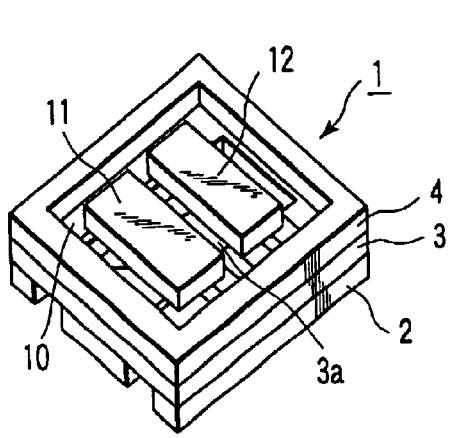
FIG. 5 is an illustrative view for showing the next manufacturing step of the optically coupled semiconductor device.

Subsequently, as shown in FIG. 5, the photovoltaic diode array 11 is inserted into the opening in the wiring substrate 1 and positioned on the electrode pad 10 in a condition where it faces the light-emitting element 6. The light-emitting element 6 thus arranged is supplied with a pressure by a bonding tool (not shown) and, further, supplied with ultrasonic vibration so that it may be flip-chip bonded. Bonding conditions include an application load pressure of 5N, a pressure application time of 200 ms, and a temperature of 250° C. A frequency of the ultrasonic vibration is set to 61 kHz and an amplitude of the chip is about 0.5 µm. Under these bonding conditions, a shear strength per bump of 1.2N is obtained.

Subsequently, the MOSFET 12 is inserted into the opening in the wiring substrate 1 and positioned in parallel with the photovoltaic diode array 11, to be flip-chip bonded to the electrode pad 10 on the top main face of the second layer 3. Bonding conditions in this case are the same as those for the photovoltaic diode array 11.

Figure 6:
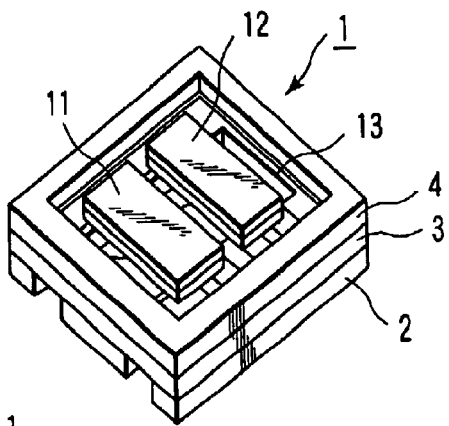
FIG. 6 is an illustrative view for showing the next manufacturing step of the optically coupled semiconductor device.
Figure 7:
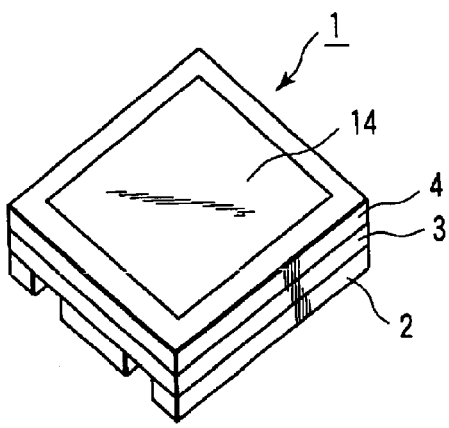
FIG. 7 is an illustrative view for showing the next manufacturing step of the optically coupled semiconductor device.

Subsequently, as shown in FIG. 6, the translucent silicone resin 13 is injected into the opening in the wiring substrate 1 to such a level as to seal the electrode pad 10 and hardened. Then, as shown in FIG. 7, the light-blocking epoxy resin 14 is injected into the opening in the wiring substrate 1 to seal the photovoltaic diode array 11 and the MOSFET 12. Finally, the sheet is divided along the dividing grooves 33, thereby completing an optically coupled semiconductor device.

As described above, the mount electrode 5 and the wire electrode 8 are arranged at the diagonal positions of the opening in the wiring substrate 1, so that it is possible to prevent the wire bonder capillary from interfering with the wiring substrate 1, without increasing a size of the opening.

Further, the opening in the wiring substrate 1 is utilized as a space for arranging the MOSFET 12 therein, so that it is unnecessary to provide an extra space on a top face of the wiring substrate 1 for arranging the MOSFET 12. Therefore, it is possible to miniaturize the optically coupled semiconductor device greatly and also improve productivity thereof.

It is to be noted that although in the first embodiment the molded base material 40 has been sub-divided by providing the dividing grooves 33, the present invention is not limited thereto; for example, the molded base material 40 may be sub-divided by a dicing cutter.

Figure 8:
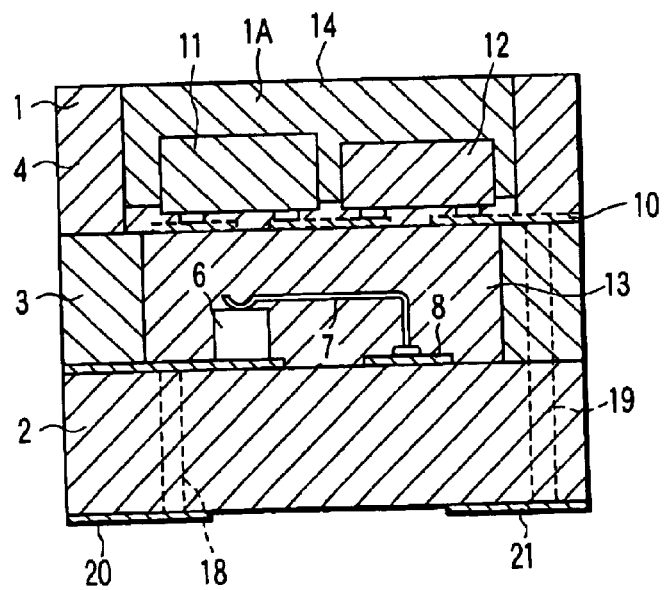
FIG. 8 is a cross-sectional view for showing an optically coupled semiconductor device structure related to a second embodiment of the present invention.

In the first embodiment, the internal electrodes 5, 8 and 10 on the wiring substrate 1 are connected with the externally connected electrodes 16 and 17 through the notches 9, 15a and 15b, but the present invention is not limited to such a constitution. As shown in FIG. 8, through-holes 18 and 19 may be vertically formed through the first and second layers 2 and 3, and inner surfaces of these through-holes 18 and 19 are wired so that through the through-holes 18 and 19, the internal electrodes 5, 8 and 10 on the wiring substrate 1 and the externally connected electrodes 16 and 17 may electrically be interconnected.

Figure 9:
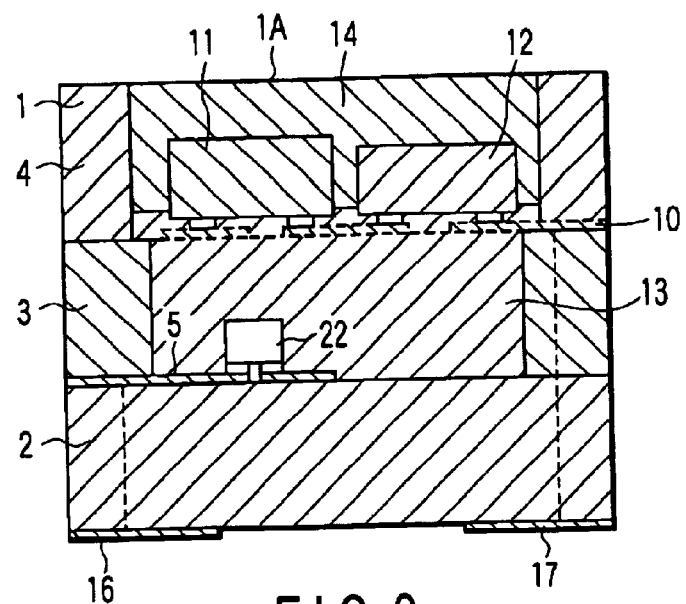
FIG. 9 is a cross-sectional view for showing an optically coupled semiconductor device structure related to a third embodiment of the present invention.
Figure 10:
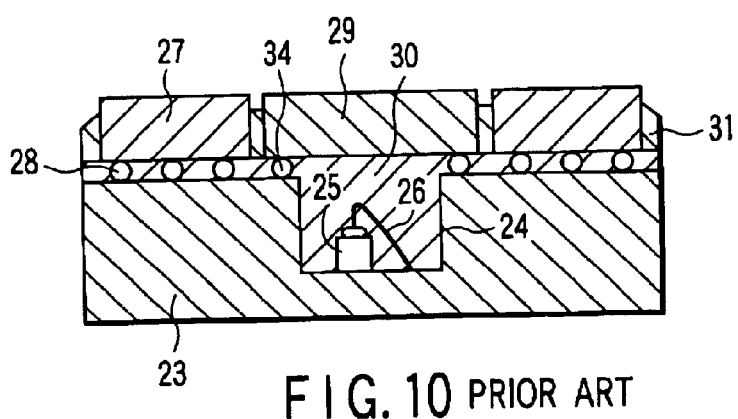
FIG. 10 is a cross-sectional view for showing a first conventional optically coupled semiconductor device structure.
Figure 11:
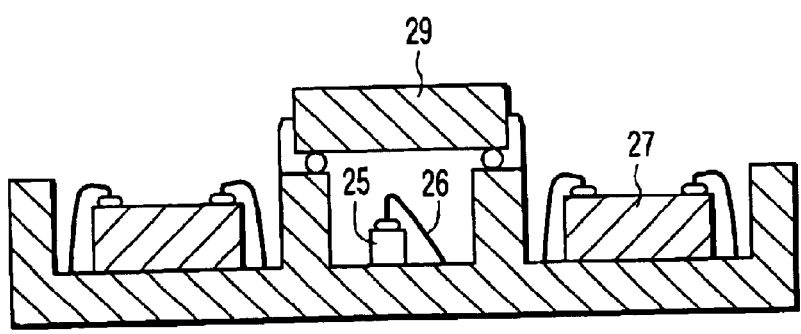
FIG. 11 is a cross-sectional view for showing a second conventional optically coupled semiconductor device structure.

Further, although in the first embodiment the light-emitting element 6 has been mounted by wire bonding, the present invention is not limited thereto; for example, as shown in FIG. 9, the light-emitting element 6 can be mounted by flip-flop bonding.

Further, although in the first embodiment, in manufacturing processes, the photovoltaic diode array 11 and the MOSFET 12 are mounted on the multi-layer wiring substrate 1 and then the silicone resin 13 is injected into the opening, the present invention is not limited thereto; for example, the order may be reversed, to inject the silicone resin 13 and then mount the photovoltaic diode array 11 and the MOSFET 12.

Further, the MOSFET 12 may be mounted after mounting the photovoltaic diode array 11 and injecting the silicone resin 13.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. An optically coupled semiconductor device comprising:
    a multi-layer wiring substrate which is constituted by stacking a second wiring substrate on a first wiring substrate and which has an opening formed in the second wiring substrate;
    a mount electrode and an electrode for wire-bonding which are formed on a top main face of the first layer and which are disposed at diagonal positions of the opening formed in the second wiring substrate;
    a light-emitting device whose one terminal is electrically connected to the mount electrode and whose other terminal is electrically connected to the electrode for wire-bonding electrode via a wire and which is arranged so that a light-emitting face thereof may face the opening;
    a first electrode pad and a second electrode pad which are provided on the top main face of the second wiring substrate in such a manner as to sandwich the opening formed in the second wiring substrate;
    a photo-receptor element which is arranged in such a manner as to block the opening formed in the second wiring substrate and which is electrically connected to the first electrode pad so that a light-receiving face thereof may face the light-emitting face of the light-emitting device;
    a switching element which is arranged in such a manner as to block the opening formed in the second wiring substrate and which is electrically connected to the second electrode pad so as to face the wire; and
    a sealant which seals the opening formed in the second wiring substrate.

2. The optically coupled semiconductor device according to claim 1, wherein the wire is extended substantially along a diagonal line of the opening.

3. The optically coupled semiconductor device according to claim 1, comprising:
    a first external electrode which is provided on a face opposite to a face on which the mount electrode of the first wiring substrate is provided; and
    a notch which is formed in a semi-circular cross section state in a side periphery face of the first wiring substrate and which is wired on its surface to electrically interconnect the mount electrode and the first external electrode.

4. The optically coupled semiconductor device according to claim 1, comprising:
    a second external electrode which is provided on a face opposite to a face on which the mount electrode of the first wiring substrate is provided; and
    a notch which is formed in a semi-circular cross section state in side periphery faces of the first and second wiring substrates and which is wired on its surface in order to electrically interconnect the electrode pad and the second external electrode.

5. The optically coupled semiconductor device according to claim 1, comprising:
    a first external electrode which is provided on a face opposite to a face on which the mount electrode of the first wiring substrate is provided; and
    a through-hole which is vertically formed through the first wiring substrate and wired on surface to electrically interconnect the mount electrode and the first external electrode.

6. The optically coupled semiconductor device according to claim 1, comprising:
    a second external electrode which is provided on a face opposite to a face on which the mount electrode of the first wiring substrate is provided; and
    a through-hole which is formed through the first and second wiring substrates and which is wired on its inner surface to electrically interconnect the electrode pad and the second external electrode.

7. An optically coupled semiconductor device manufacturing method comprising:
    stacking a second wiring substrate having an opening on a first wiring substrate to constitute a multi-layer wiring substrate;
    forming a mount electrode and an electrode for wire-boding on a top main face of the first wiring substrate so that they may be disposed at diagonal positions of the opening;
    electrically connecting one terminal of a light-emitting device to the mount electrode and the other terminal to the electrode for wire-bonding via a wire so that its light-emitting face may face the opening;
    providing a first electrode pad and a second electrode pad on the top main face of the second wiring substrate so as to sandwich the opening formed in the second wiring substrate;
    arranging a photo-receptor element in such a manner as to block the opening formed in the second wiring substrate and electrically connecting the photo-receptor element to the first electrode pad so that its light-receiving face may face the light-emitting face of the light-emitting device;
    arranging a switching element in such a manner as to block the opening formed in the second wiring substrate and electrically connecting the switching element to the second electrode pad so that the switching element may face the wire; and
    sealing the opening in the second wiring substrate with a sealant.

8. The optically coupled semiconductor device manufacturing method according to claim 7, wherein:
    the plurality of multi-layer wiring substrates are formed on a molded base material; and
    dividing grooves are previously formed in the molded base material to partition the molded base material into the multi-layer wiring substrates, thereby separating the wiring substrates from each other along the dividing grooves.

9. The optically coupled semiconductor device manufacturing method according to claim 7, wherein:
    the plurality of multi-layer wiring substrates are formed on the molded base material; and
    the molded base material is divided into the multi-layer wiring substrates by a dicing cutter.

* * * * *